United States Patent
Pozder et al.

(10) Patent No.: US 7,276,435 B1
(45) Date of Patent: Oct. 2, 2007

(54) DIE LEVEL METAL DENSITY GRADIENT FOR IMPROVED FLIP CHIP PACKAGE RELIABILITY

(75) Inventors: Scott K. Pozder, Austin, TX (US); Kevin J. Hess, St. Ismier (FR); Ruiqi Tian, Austin, TX (US); Edward O. Travis, Austin, TX (US); Trent S. Uehling, New Braunfels, TX (US); Brett P. Wilkerson, Austin, TX (US); Katie C. Yu, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 11/445,657

(22) Filed: Jun. 2, 2006

(51) Int. Cl.
*H01L 21/44* (2006.01)

(52) U.S. Cl. ............... 438/597; 438/612; 438/622; 716/9; 716/10

(58) Field of Classification Search ............ 438/622, 438/597; 716/9, 10
See application file for complete search history.

(56) References Cited

U.S. PATENT DOCUMENTS

| | | | |
|---|---|---|---|
| 5,739,587 A * | 4/1998 | Sato .................. | 257/758 |
| 6,020,647 A * | 2/2000 | Skala et al. .......... | 257/784 |
| 6,037,668 A | 3/2000 | Cave et al. .......... | 257/784 |
| 6,187,658 B1 | 2/2001 | Chittipeddi et al. ...... | 438/612 |
| 6,756,675 B1 * | 6/2004 | Tanaka ................ | 257/758 |
| 6,960,835 B2 * | 11/2005 | Barth et al. ........... | 257/758 |
| 7,026,225 B1 * | 4/2006 | Hau-Riege et al. ...... | 438/468 |
| 7,081,679 B2 * | 7/2006 | Huang et al. .......... | 257/779 |
| 2002/0025417 A1 | 2/2002 | Chisholm et al. ........ | 428/209 |

OTHER PUBLICATIONS

U.S. Appl. No. 11/033,009, filed Jan. 11, 2005, entitled "Integrated Circuit Having Structural Support for a Flip-Chip Interconnect Pad and Method Therefor".
U.S. Appl. No. 10/700,883, filed Nov. 4, 2003, entitled "Method of Implementing Polishing Uniformity and Modifying Layout Data".

* cited by examiner

*Primary Examiner*—Michael Lebentritt
*Assistant Examiner*—Angel Roman
(74) *Attorney, Agent, or Firm*—Hamilton & Terrile, LLP; Michael Rocco Cannatti

(57) ABSTRACT

An integrated circuit has metal bumps on the top surface that create a potentially destructive stress on the underlying layers when the metal bumps are formed. Ensuring a minimum metal concentration in the underlying metal interconnect layers has been implemented to reduce the destructive effect. The minimum metal concentration is highest in the corners, next along the border not in the corner, and next is the interior. The regions in an interconnect layer generally under the metal bump require more concentration than adjacent regions not under a bump. Lesser concentration is required for the metal interconnect layers that are further from the surface of the integrated circuit. The desired metal concentration is achieved by first trying a relatively simple solution. If that is not effective, different approaches are attempted until the minimum concentration is reached or until the last approach has been attempted.

20 Claims, 3 Drawing Sheets

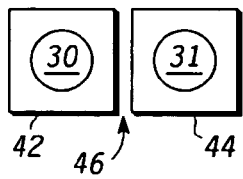
FIG. 3
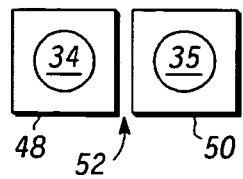
FIG. 4
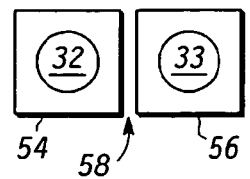
FIG. 5
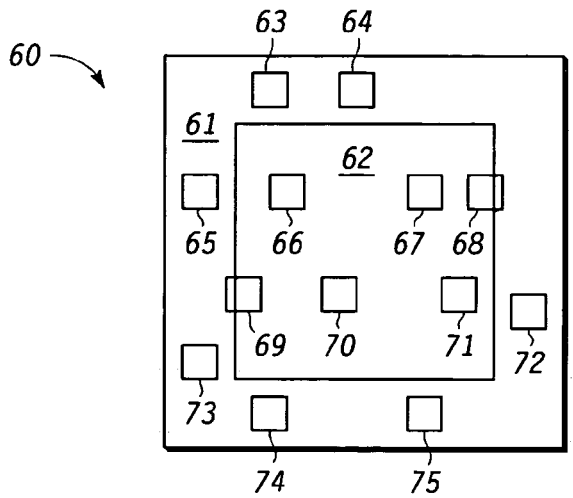
FIG. 6
|     | DCB | DCO | DBB | DBO | DIB | DIO |
|-----|-----|-----|-----|-----|-----|-----|
| TM  | D1  | D2  | D3  | D4  | D5  | D6  |
| TM-1 | D11 | D12 | D13 | D14 | D15 | D16 |
| TM-2 | D21 | D22 | D23 | D24 | D25 | D26 |
| TM-3 | D31 | D32 | D33 | D34 | D35 | D36 |
| TM-4 | D41 | D42 | D43 | D44 | D45 | D46 |
| ⋮   | ⋮   | ⋮   | ⋮   | ⋮   | ⋮   | ⋮   |
| TM-N | DN1 | DN2 | DN3 | DN4 | DN5 | DN6 |
FIG. 7

DIE LEVEL METAL DENSITY GRADIENT FOR IMPROVED FLIP CHIP PACKAGE RELIABILITY

BACKGROUND OF THE INVENTION

1. Field of the Invention

The present invention is directed in general to the field of semiconductor devices. In one aspect, the present invention relates to the use of die level metal tiling or dummy features to improve structural integrity of an integrated circuit.

2. Description of the Related Art

The use of conductive balls, such as solder balls, to make electrical connection to a bond pad is a known method to make electrical connection to electrical circuitry of a semiconductor die. Conductive ball packaging is one type of semiconductor packaging known in the industry as flip chip interconnection. As geometries in semiconductors continue to shrink in size due to improvements in the technology for making semiconductors, the sizes of bond pad regions have become smaller, resulting in increased stress to the bond pad structure when physical connection is made to the semiconductor die. Additional mechanical integrity problems are created by the interconnect structures used with the manufacturing smaller geometry semiconductors. For example, bond pad structures fabricated with copper interconnect metallization and low dielectric constant (low-k) dielectrics are susceptible to mechanical damage during the bonding process, due to the lower Young's modulus and lower fracture toughness of such materials. As a result, the underlying stack of metal and dielectric layers in such bond pad structures may mechanically fracture or delaminate more easily or otherwise be subject to package to die mismatch stresses (such as generated during die attach process) resulting in package level die failures.

Conventional approaches for addressing the structural integrity problems have increased the metal tiling density only in the region beneath the flip chip bond pads. Other approaches used in die with ultra low-k (ULK) dielectrics have required exclusion of ULK from the upper layers of the interconnect stack to meet package requirements, or have required replacement of the ULK with TEOS in the case of copper padless designs where last metal wiring is selectively connected to the bump metallurgy. As a result, prior methods of generating tiling under and near the pads do not provide the optimal density, spacing and positioning of tiles over a whole die, or otherwise result in die having reduced or diminished performance or increased fabrication costs.

Accordingly, there is a need for improved semiconductor processes and devices having advanced circuit interconnects in the die that use low modulus, low hardness, and low dielectric constant materials that can meet package toughness requirements with minimum interference with die design. There is also a need for a flip chip fabrication process which improves the die reliability in reflow and package environments by optimizing metal tiling density across the entire die. In addition, there is a need for a semiconductor manufacturing process and design which overcomes the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings, in which:

FIG. 3 illustrates a top plan view of selected stress regions associated with two example conductive bumps located in a corner stress zone of the die depicted in FIG. 1;

FIG. 4 illustrates a top plan view of selected stress regions associated with two example conductive bumps located in an interior stress zone of the die depicted in FIG. 1;

FIG. 5 illustrates a top plan view of selected stress regions associated with two example conductive bumps located in a border stress zone of the die depicted in FIG. 1;

FIG. 6 illustrates a simplified top plan view of a die having a border stress zone and an interior stress zone in which a plurality of stress regions are defined;

FIG. 7 is an example table of metal densities by top-down metal layer chip designs where the densities are provided for each region of the chip, based on the applicable stress zone and stress region.

Figure 1:
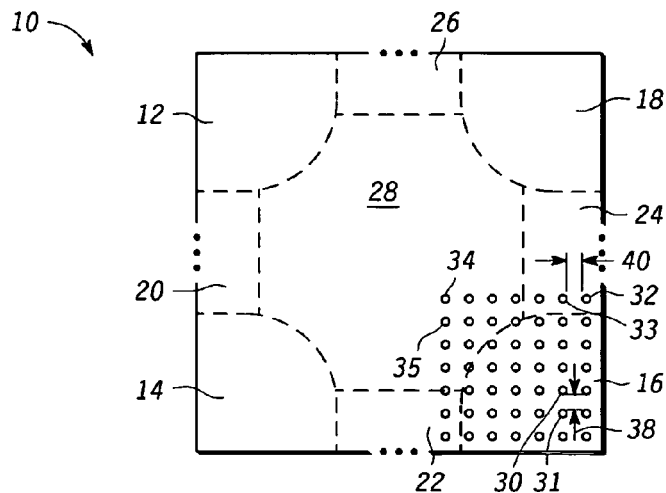
FIG. 1 illustrates a top plan view of a die in which conductive bumps are positioned in one or more defined stress zones in accordance with various embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for manufacturing a semiconductor device having improved reliability using a die level tiling methodology to toughen weak copper/ULK layers in different stress zones of a packaged copper/ULK backend flip chip die. By providing different metal densities in the different stress zones of a die, the relative intensity and strength of the die may be increased in the areas (such as corner or border zones) having higher metal density. The structural integrity may be further strengthened by increasing the metal density in a force or stress region spanning the portion of the integrated circuit directly underlying the conductive bond pads and extending laterally a limited distance. To increase the metal density in a defined area of a layer, the defined area is surveyed to determine whether its metal density meets a required threshold, and if not, metallic features (such as tiles or metal fill structures) are inserted in the layout design using an iterative process of inserting smaller and smaller tiles until the required density threshold is met. As will be appreciated, the metal density may be increased by inserting any type of metallic features, such as tiles, tiling, dummy fill, metal fill, dummy features, dummy fill inserts or other fill features. The process may be applied to the entire layer, and separately to each layer. In addition, a different required density threshold may be set for each stress zone and/or stress region, resulting in different metal densities for different stress zones and regions defined in the die plane and/or vertically, so that each stress zone has its own distribution or density of metal traces in the ULK layers, and each stress region within each stress zone has its own its own distribution or density of metal traces in the ULK layers. The resulting gradient in tiling (e.g., from center to edge and from last metal to substrate) may be used to provide an optimal density, spacing and positioning of tiles over a whole die, thereby enabling the design of circuit interconnects in the advanced die using low modulus, low hardness, and low dielectric constant materials that can meet package toughness requirements with minimum interference with die design.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials (such as metal tiling layers) will be formed and removed to fabricate the semiconductor structure. Where the specific procedures for forming or removing such materials are not detailed below, conventional techniques to one skilled in the art for growing, depositing, masking, etching, removing or otherwise forming such layers at appropriate thicknesses and dimensions may be used. Such details are well known and not considered necessary to teach one skilled in the art of how to make or use the present invention.

Turning now to FIG. 1, there is illustrated a top plan view of a die 10 in which a plurality of flip-chip metal bumps (e.g., 30, 31, 32, 33, 34, 35) are located in one or more defined stress zones. In the depicted example, only a subset of all possible flip-chip bumps are shown in the lower right corner of the die 10, where a certain minimum vertical spacing (e.g., 38) and horizontal spacing (e.g., 40) exists between bumps. At any given layer, the die 10 may be defined to include corner stress zones (e.g., 12, 14, 16, 18), border stress zones (e.g., 20, 22, 24, 26) and/or interior stress zones (e.g., 28). By separating a die area into at least two stress zones (e.g., the border and the interior), the metal density of the interior stress zone may be set to meet a first minimum predetermined threshold density, while the metal density of the border stress zone may be set to meet a second, higher minimum predetermined threshold density. As will be appreciated, the metal density levels in each zone may be separately established in each layer of the device, starting with the top metal layer and proceeding down to first metal. However, in a selected embodiment, the metal density levels for the top four metal interconnect layers are uniformly established by stress zone and region, while the metal density levels for the lower metal interconnect layers are established independently.

While minimum predetermined threshold densities can be set for each stress zone in a given layer (e.g., interior zone 28), within each stress zone, the metal density may be further increased in the force or stress region around and below each pad using a predetermined layout pattern of metallization and dielectric in the interconnect stack underlying the pad. In this way, one or more stress regions are defined in the vertical dimension. This may be illustrated with reference to FIG. 2, which depicts in cross-sectional form a portion of an integrated circuit 11 having a flip chip bond pad overlying a substrate 102. The substrate 102 may be formed of any material, and is typically a semiconductor, such as silicon. Within substrate 102 may be formed one or more semiconductor devices (not shown). Overlying substrate 102 is a plurality of interconnect layer and interlayer dielectrics (ILDs) 81. For example, a last interconnect or last metal (LM) layer 91 overlies a last ILD (LILD) or via layer 92. The last ILD 92 overlies a next-to-last (LM-1) interconnect or metal line layer 93. The next-to-last interconnect layer 93 overlies a next-to-last ILD (LILD-1) or via layer 94. The next-to-last ILD 94 overlies a second-from-last (LM-2) interconnect layer 95. The second-from-last interconnect layer 95 overlies a second-from-last ILD (LILD-2) or via layer 96. The second-from-last ILD 96 overlies a third-from-last (LM-3) interconnect layer 97, and so on.

Figure 2:
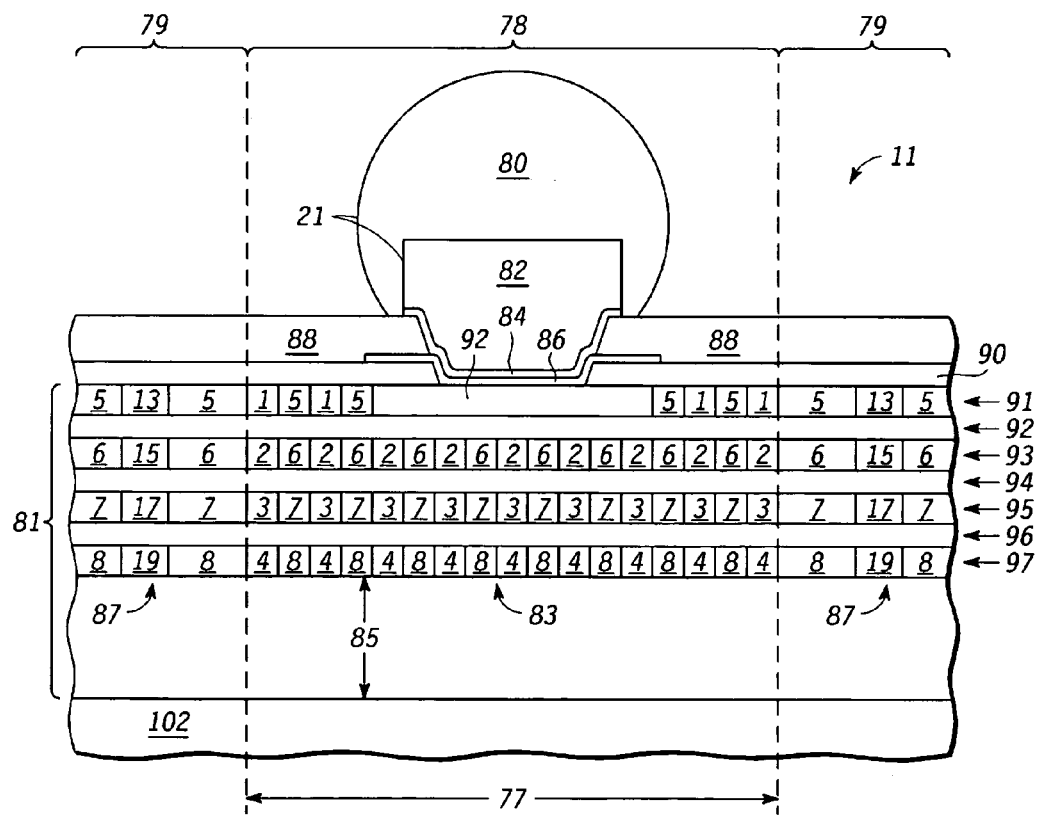
FIG. 2 illustrates in cross-sectional form a portion of an integrated circuit having a flip chip bond pad having a first metal density formed in the layers below a conductive bump in a first stress region and having a second metal density formed outside the first stress region.

In addition, the integrated circuit 11 embodiment depicted in FIG. 2 includes a conductive bump contact structure 21 which includes a rigid or stiff structural component 82 (such as a stud formed of copper, tantalum, tungsten, chromium or the like) and/or a conductive solder ball 80 (such as tin (Sn) and lead (Pb) solder, or some other electrically conductive material or alloy). The conductive bump contact structure 21 is integrally attached to the underlying structure, such as by being positioned over and in contact with an optional under bump metallization layer(s) 84, metal cap 86 or conductive bond pad 92 in the last metal line layer 91. As will be appreciated, various metals or other conductive materials may be used to form the conductive bump contact structure 21 and underlying contact layers 84, 86, 92. In addition, insulating layers 90 and polyamide layers 88 may be formed adjacent to the conductive bump contact structure 21 to passivate the underlying metal in the last interconnect layer 91. For example, a passivation layer 90 may be formed by depositing $Si_3N_4$ or SiON over selected portions of the dielectric in the last interconnect layer 91 and the bonding pad 92, and then forming an opening or hole in the passivation layer 90 through which electrical and physical contact may be made with the bonding pad 92 (such as by using a metal cap layer 86). An additional passivation layer 88 may optionally be formed of a polyimide layer (to provide a stress buffer) or other passivation materials (such as $Si_3N_4$ or SiON) over selected portions of the first passivation layer 90 and metal cap layer 86, thereby forming an opening or hole through which the under bump metallization layer 84 makes electrical and physical contact with the metal cap layer 86.

As depicted in FIG. 2, the interconnect layers 81 may be horizontally divided into a first stress region 78 (below a conductive bump 21) and a second stress region 79 which is outside the first stress region 78. The present invention allows the metal density of the interconnect layers in the first stress region 78 to be set to a first density or concentration value, while the metal density of the interconnect layers in the second stress region 79 is set to a second (e.g., lower) density or concentration value.

For example, the first density or concentration value may be set in the first stress region 78 by forming a support structure 83 with a predetermined pattern of metal layers 1, 2, 3, 4 in one or more of the interconnect layers 91, 93, 95, 97. In the embodiment shown, each interconnect layer 91, 93, 95, 97 includes dielectric layers 5, 6, 7, 8 that electrically isolate and separate the metal lines. As for the lateral extent of the support structure 83, a stress boundary 77 defines a force region spanning the portion of the integrated circuit directly underlying the conductive bond pad 92 and extending laterally a limited distance. The force region is a region within the integrated circuit 11 in which forces are exerted on the interconnect layers by the conductive bump 21. While the shape and contour of the force region may be arbitrarily defined, depending upon device technology and geometries, in an exemplary embodiment involving a square conductive bond pad 92 having lateral dimensions of 75×75 microns, the stress boundary 77 defines a cubic force region having lateral dimensions of 140×140 microns centered about the conductive pad 92. Alternatively, the lateral area of the stress boundary 77 may be defined as a ratio of the pad area to the stress boundary area (e.g., Pad Area/Stress Boundary Area=0.287).

As depicted, each interconnect layer 91, 93, 95, 97 in the first stress region 78 includes a parallel-type lines, such as metal lines 1 in the LM layer 91, metal lines 2 in the LM-1 layer 93, metal lines 3 in the LM-2 layer 95, and metal lines 4 in the LM-3 layer 97. However, it will be appreciated that other patterns may be used, including orthogonal or perpendicular-type patterns, a combination of orthogonal and parallel lines configured in a Cartesian or "Manhattan" configuration structure, a random x-y type pattern, or a totally random pattern of metal lines. By increasing the density of the patterned metal layers 1, 2, 3, 4 in the interconnect layers 91, 93, 95, 97 of the first stress region 78 to a predetermined or required metal density, the overall strength and toughness of the die 11 in the vicinity of the conductive bump 21 may be improved. For example, the integrated circuit 11 may be strengthened with a 30–35 percent metal-to-dielectric density in the support structure region 83. In another embodiment, the predetermined metal density is forty percent. Generally, a range for the minimum metal density in the first stress region 78 is from thirty percent to seventy percent, but it should be appreciated that values other than those within this range may adequately provide structural support depending upon the materials used and the layout of the metal lines.

In similar fashion, a second density or concentration value may be set in the second stress region 79 by forming a predetermined pattern 87 of metal layers 13, 15, 17, 19 separated by dielectric layers 5, 6, 7, 8 in one or more of the interconnect layers 91, 93, 95, 97. While any desired pattern of metal lines may be used, FIG. 2 shows that each interconnect layer 91, 93, 95, 97 in the second stress region 79 includes a parallel-type pattern of metal lines, such as metal lines 13 in the LM layer 91, metal lines 15 in the LM-1 layer 93, metal lines 17 in the LM-2 layer 95, and metal lines 19 in the LM-3 layer 97. While the illustrated metal line density in the second stress region 79 is lower than the metal line density in the first stress region 78, the present invention allows the metal line density in the second stress region 79 to be increased over what is otherwise randomly present in the existing circuit design so that a certain minimum threshold metal density is obtained in the second stress region 79. By increasing the density of the patterned metal layers 13, 15, 17, 19 in the interconnect layers 91, 93, 95, 97 of the second stress region 79, the overall strength and toughness of the die 11 outside of the first stress region may be improved. For example, the integrated circuit 11 may be strengthened with a 20–30 percent metal-to-dielectric density in the second stress region 79. In another embodiment, the predetermined metal density is forty percent. Generally, a range for the minimum metal density in the second stress region 79 is from twenty percent to seventy percent, but it should be appreciated that values other than those within this range may adequately provide structural support depending upon the materials used and the layout of the metal lines.

In addition to using stress zones and force regions to define and set metal densities for an entire die layer, the die level metal density gradient techniques disclosed herein may be applied separately to each die layer, or to groups of die layers. For example, the metal densities in the stress zones may be uniformly set in the upper layers (e.g., from the last metal down to LM-3), while the metal densities in the lower layers (e.g., down to first metal) are set independently. This is illustrated in FIG. 2 which shows an example where the plurality of interconnect layers 81 in the first stress region 78 are vertically divided into a first upper or vertical stress zone 83 and a second lower or vertical stress zone 85. In this way, the interconnect stack is separated vertically into at least an upper stress zone and a lower stress zone, allowing the metal densities in the border and interior stress zones to be separately defined in the upper and lower stress zones.

FIGS. 3–5 are provided to show how different metal densities can be applied to different stress regions within different zones. For example, FIG. 3 illustrates a top plan view of selected stress regions 42, 44 associated with two example metal bumps 30, 31 located in a corner stress zone 16 of the die 10 depicted in FIG. 1. As depicted, each bump 30, 31 has an associated force or stress region 42, 44 where a relatively higher metal density is formed, while the regions 46 outside of the stress regions 42, 44 have a lower metal density formed therein. In a selected embodiment where the corner stress zone 16 has a minimum predetermined threshold metal density (e.g., 30–35%), then the stress regions 42, 44 in the corner stress zone 16 have a relatively higher metal density (e.g., 35–40%). As will be appreciated, stress regions in other stress zones can be designed to have different metal densities. For example, FIG. 4 illustrates a top plan view of selected stress regions 48, 50 associated with two example bumps 34, 35 located in an interior stress zone 28 of the die 10 depicted in FIG. 1. Again, each bump 34, 35 has an associated force or stress region 48, 50 where a relatively higher metal density is formed, while the regions 52 outside of the stress regions 48, 50 have a lower metal density formed therein. In a selected embodiment where the interior stress zone 28 has a minimum predetermined threshold metal density (e.g., 20%), then the stress regions 48, 50 in the interior stress zone 28 have a relatively higher metal density (e.g., 30%). FIG. 5 illustrates yet another example of a top plan view of selected stress regions 54, 56 associated with two example bump pads 32, 33 located in a border stress zone 24 of the die 10 depicted in FIG. 1. As described above, any desired metal density may be formed in the stress regions 54, 56, provided that the metal density in stress regions 54, 56 (e.g., 35%) is higher than the metal density in the region 58 outside of the stress regions 54, 56 (e.g., 30%).

As will be appreciated, there will be occasions when the stress region associated with a bump pad will overlap two or more stress zones in a given layer, such as can occur when the conductive bumps are randomly located on the die. This may be addressed by setting the metal density of any overlapping stress region to the higher of the metal densities of the two stress zones. This is shown in FIG. 6, which illustrates a simplified top plan view of a die 60 having a border stress zone 61 and an interior stress zone 62 in which a plurality of stress regions 63–75 are defined. In an example embodiment of a 7×7 mm die, the border stress zone is defined as 613 µm in from edge seal of die, while the interior stress zone is defined as the die area inside the border stress zone. As illustrated, the metal density of the interior stress zone 62 (outside of any stress regions) may be set to a first predetermined minimum threshold (e.g., 20%) while the metal density of the border stress zone 61 (outside of any stress regions) may be set to a second predetermined minimum threshold (e.g., 30%). As for the stress regions contained wholly within the interior stress zone 62 (such as stress regions 66, 67, 70 and 71), the metal density in these stress regions may be set to a first elevated metal density (e.g., 30%). Finally, the stress regions contained wholly within or overlapping the border stress zone 61 (such as stress regions 63, 64, 65, 68, 69, 72, 73, 74, 75) may have the metal density set to a second elevated metal density (e.g., 35%).

As described herein, the present invention may be implemented using two or three different metal densities to toughen the interconnect layers and improve reliability. For example, if the die is horizontally separated into an interior stress zone and a border stress zone which are respectively assigned minimum metal densities of 20% and 30%, and if the stress regions associated with each conductive metal bump or pad are assigned a density increment of 10% over the underlying minimum metal density, then the entire die will be fabricated with three metal tiling densities—20% (for the portions of the interior stress zone outside of any stress regions), 30% (for the portions of the border stress zone outside of any stress regions or for any stress regions in the interior stress zone), and 40% (for any stress regions in the border stress zone).

In addition, the present invention may be used to provide different metal densities for different regions within a layer, and to provide different metal densities for different layers within an integrated circuit. This is illustrated with the table shown in FIG. 7 which lists metal densities by top-down metal layer in an integrated circuit having three stress zones (corner, border, interior), where the densities are provided for each layer and region of the chip, based on the applicable stress zone and stress region. Each row in the table corresponds to a metal layer, starting with the top metal layer (labeled TM) and proceeding down to the TM-N metal layer (e.g., first metal layer). The first column (labeled DCB for Density Corner Bump) contains the metal density values in the corner stress zone for any bump stress regions, where the density values in each row (e.g., D1, D11, D21, D31, D41 . . . DN1) may be individually set to any desired value. The second column (labeled DCO for Density Corner Open) contains the metal density values (e.g., D2, D12, D22, D32, D42 . . . DN2) in the corner stress zone for any regions outside of the bump stress regions. The density values for the border stress zones are listed in the third and fourth columns, labeled DBB (for Density Border Bump) and DBO (for Density Border Open), respectively. Again, the listed metal density values in the border stress zone for any bump stress regions (e.g., D3, D13, D23, D33, D43 . . . DN3) and for regions outside the bump stress regions (e.g., D4, D14, D24, D34, D44 . . . DN4) may be individually set to any desired value. Finally, density values for the interior stress zones are listed in the fifth and sixth columns, labeled DIB (for Density Interior Bump) and DIO (for Density Interior Open), respectively, where the listed metal density values in the interior stress zone for any bump stress regions (e.g., D5, D15, D25, D35, D45 . . . DN5) and for regions outside the bump stress regions (e.g., D6, D16, D26, D36, D46 . . . DN6) may be individually set to any desired value. Generally, the bump density values (e.g., DCB) will be higher than the open density values (e.g., DCO) for a given zone.

Figure 8:
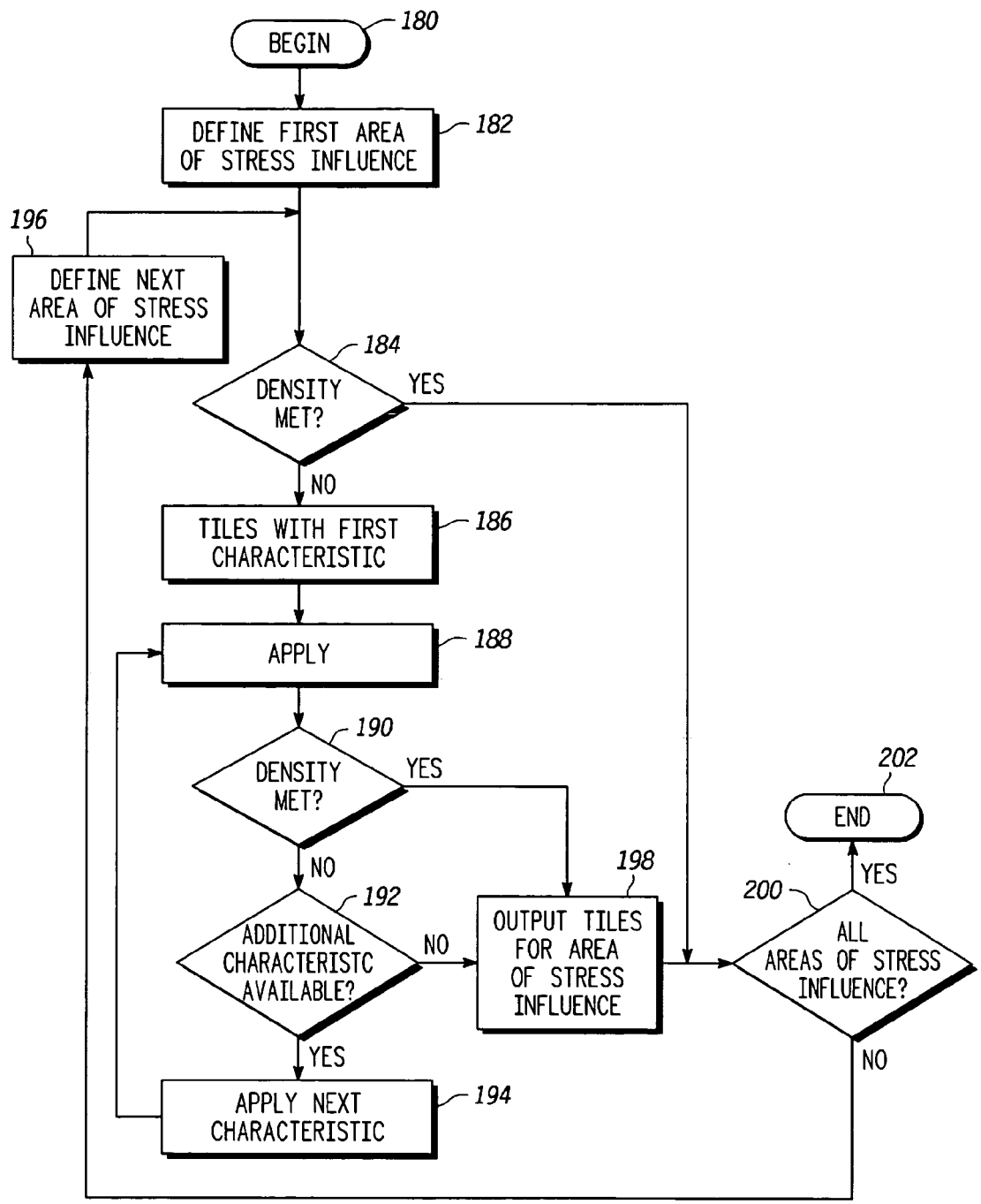
FIG. 8 illustrates in flow chart form an exemplary design methodology for controlling the metal tiling density in predefined areas on a die.

In accordance with various embodiments of the present invention, a design and fabrication methodology is provided to ensure that a minimum metal concentration is provided in the metal interconnect layers across the entire die. With this methodology, different regions and different layers of an integrated circuit may be separately strengthened, based on the location of the region in relation to certain defined stress zones and in relation to the conductive metal bumps. FIG. 8 illustrates in flow chart form an exemplary design methodology for controlling the metal tiling density in predefined areas on a die. Though selected embodiments of the methodology are illustrated in FIG. 8, it will be appreciated that the sequence of illustrated steps may be modified, reduced or augmented in keeping with the disclosure of the present invention. For example, one or more of the steps may optionally be included or excluded. Thus, it will be appreciated that the methodology of the present invention may be thought of as performing the identified sequence of steps in the order depicted in FIG. 8, though the steps may also be performed in parallel, in a different order, or as independent operations that are combined.

As depicted, the methodology begins at step 180, where an existing circuit design for an interconnect layer in an integrated circuit is received. By starting with a circuit design which has existing metal lines connecting the circuit components through the interconnect layers, additional metal tiling may be added to different regions of the layer to meet a minimum threshold density requirement, such as by inserting additional tiling in areas where the existing circuit design has none, thereby increasing the metal density in such areas. The insertion of additional tiling may be done in an iterative process, as described hereinbelow, whereby different sizing approaches are used to fit additional tiling into any available area.

In particular, a first area of stress influence in a given layer is defined at step 182. The first area of stress influence may be defined as the stress region under a bond pad where dummy tiling will be added to strengthen the bond pad stress regions, or may instead by defined as a predefined area outside of the bond pad stress regions where dummy tiling will be added to strengthen these outer areas. In a selected embodiment where the area below and around the conductive pads are being tiled, the area of stress influence is defined with reference to a force region that is centered around a conductive bump, so that each layer under a conductive bump has a stress region containing a metallization pattern for the interconnect layers from the existing circuit design. Alternatively, the tiling process may also be applied outside of the bond pad stress regions using a check-box type approach to define predetermined areas in each layer. The check box approach forces a more uniform tiling by calculating metal density of measurement boxes that are sized a fraction of the region checked. The check box indexing can be edge to edge or have a partial overlap when indexed over the region with each check box passing metal density when the prescribed density for that region is met.

Once an area of stress influence is defined, the area is surveyed at step 184 to determine if the metal density of the existing circuit design meets a predetermined density threshold (e.g., 40%). If the existing metal density in the defined area exceeds the predetermined density threshold (affirmative outcome of step 184), then no additional tiling needs to be inserted in that area, and it is determined if there are any other areas of stress influence that require processing (step 200).

On the other hand, if the existing metal density in the defined area does not meet the predetermined density threshold (negative outcome of step 184), then a calculation or computation is performed to determine if the metal density can be increased by inserting additional tiles into any available space in the defined area using one or more sizing approaches. For example, tiles may be iteratively inserted at higher and higher densities to bring the density in the defined area to the predetermined density threshold. This iterative process is depicted in FIG. 8, where tiles having a first characteristic spacing and width are retrieved (step 186) and inserted or applied (step 188) to the available space. For example, rectangular tiles having the first characteristic width and spacing may first be inserted orthogonally into the available space, followed by inserting the tiles in parallel. The defined area is then surveyed at step 190 to determine if the metal density of the calculated circuit design (including the inserted tiles having the first characteristic spacing) meets the predetermined density threshold (e.g., 40%). If the calculated metal density in the defined area meets the predetermined density threshold (affirmative outcome of step 190), then the additional tiles are output with the circuit design for the defined area (step 198) and it is determined if there are any other areas of stress influence that require processing (step 200).

If the calculated metal density in the defined area does not meet the predetermined density threshold (negative outcome of step 190), it is then determined whether there are any additional tiles having a different characteristic spacing and width that have not been applied (step 192). If there are additional tiles available (affirmative outcome of step 192), then these additional tiles are retrieved (step 194) and inserted or applied (step 188) to the available space in the defined area. At this point, the defined area is again surveyed (step 190) to determine if the metal density of the calculated circuit design (including the inserted tiles having the first and additional characteristic spacings) meets a predetermined density threshold (e.g., 40%), and the loop continues until the predetermined density threshold is met (affirmative outcome of step 190). Whenever there are no additional tiles available (negative outcome of step 192), then any applied tiles are output with the circuit design for the defined area (step 198). Next, it is determined if there are any other areas of stress influence in the layer that require processing (negative outcome of step 200), at which time the next area of stress influence is defined (step 196) and the process repeats beginning with the density survey step 184. When there are no additional areas to process in the area (negative outcome of step 200), the process ends for that layer (step 202) or proceeds to the next layer, where the entire process repeats.

In this way, the metal density across the entire layer may be increased to the predetermined density threshold. In addition or in the alternative, different density thresholds may be used for different stress zones within a layer, or for different stress regions located on a layer. For example, each pad area may have an associated area of stress influence which is processed in sequence to increase the metal tiling density, or each of these areas can be processed simultaneously or in parallel to speed up the process. Then, after the tiles are inserted in the pad-related areas of stress influence, the remaining areas of stress influence in the layer may be tiled using a tiling process that is targeted to predetermined minimum threshold densities, depending on the location of the area in relation to one or more stress zones. By repeating the process for each layer, the density dependency for intra-layer and inter-layer effects can be accounted for in the course of inserting tiling to increase the metal density of the die.

In addition, it may be desired to control or limit the maximum or minimum line width of metals in the different regions such that metal width could be optimized for the stress regions and the zone that the stress region lies in. While the tiles may vary in size in order to achieve the required density or concentration, this line width limit might also be implemented as a requirement for the original design data independent of the tile placement requirements. The tile size may also be controlled or limited as needed to optimize the line width of the tiles that are added to the layout. For example, if narrow lines are found to be more robust, then there may be limits on the maximum line width allowed in the regions in the corner and border zones of the chip. Likewise, the sizing approach chosen for meeting the target metal density in a region might favor smaller lines in regions in the corner and border zones.

By now it should be appreciated that there has been provided a method for making an integrated circuit. As a preliminary matter, an integrated circuit design is provided that includes a design for a first metal interconnect layer and for metal bump locations on a top surface of the integrated circuit. For at least a first metal interconnect layer, a first stress region is defined that includes a portion under a metal bump location, where the first stress region has a required first metal concentration. In addition, a second stress region is defined that is adjacent to the first stress region in the first metal interconnect layer, but that is not located under a metal bump location. The second stress region has a required second metal concentration that is less than the first metal concentration. An integrated circuit is then built by increasing the metal density in the first metal interconnect layer in the first stress region to at least achieve the first metal concentration, and by increasing the metal density in the second stress region to at least achieve the second metal concentration in the second stress region. The method may also include defining a first zone (e.g., a corner or border portion of the integrated circuit) and a second zone (e.g., border portion not including the corner portions of the integrated circuit or an interior portion) in each integrated circuit layer. With these zones, the first and second stress regions in the first interconnect layer are located in the first zone, while a third stress region (having a portion under a metal bump and a required third metal concentration that is less than the first metal concentration) and an adjacent fourth stress region (having no portion under a metal bump and a required fourth metal concentration that is less than the second metal concentration) are defined to be located in the second zone. With these additional stress regions defined, the integrated circuit may be built by increasing the metal density in the first metal interconnect layer in the third stress region to at least achieve the third metal concentration, and by increasing the metal density in the fourth stress region to at least achieve the fourth metal concentration in the fourth stress region. The method may further include defining a third zone (e.g., an interior portion of the integrated circuit not including border or corner portions) in which is located a fifth stress region (having a portion under a metal bump and a required fifth metal concentration that is less than the third metal concentration) and an adjacent sixth stress region (having no portion under a metal bump and a required sixth metal concentration that is less than the fourth metal concentration). With these additional stress regions defined, the integrated circuit may be built by increasing the metal density in the first metal interconnect layer in the fifth stress region to at least achieve the fifth metal concentration, and by increasing the metal density in the sixth stress region to at least achieve the sixth metal concentration in the sixth stress region. The method may be repeated for a second metal interconnect layer by defining stress regions (e.g., third and fourth stress regions) in the second metal interconnect layer having respective required metal concentrations (e.g., third and fourth required metal concentrations), and then building the integrated circuit by increasing the metal density in the second metal interconnect layer in the respective stress regions to at least achieve the respective required metal concentrations. As will be appreciated the second metal interconnect layer may be located above or below the first metal interconnect layer, and there may be a plurality of metal interconnect layers located above, between or below the first metal interconnect layer and the second metal interconnect layer. In a selected embodiment, the metal density is increased in each region by calculating a first proposed metal concentration based on a first sizing approach to adding metal to region. If the first proposed metal concentration is less than the required first metal concentration, a second sizing approach (e.g., changing a direction of orientation of the tiling from the first sizing approach) is used to add metal to the first interconnect layer in order to achieve at least the required first metal concentration. The different sizing approaches may include a first sizing approach which adds a plurality of metal strips of a first width, and a second sizing approach which adds a plurality of metal strips of a second, different width.

In another form, a method is provided for making an integrated circuit. As a preliminary matter, an integrated circuit design is provided that includes a design for a first metal interconnect layer and for metal bump locations on a top surface of the integrated circuit. For at least a first metal interconnect layer, a stress region is defined that includes a portion under a metal bump location, where the first stress region has a required first metal concentration. In the first stress region, the metal density is increased by calculating a first proposed metal concentration based on a first sizing approach to adding metal to the first stress region. If the first proposed metal concentration is less than the required first metal concentration, a second sizing approach (e.g., changing a direction of orientation of the tiling from the first sizing approach) is used to build the integrated circuit by adding metal to the first interconnect layer in order to achieve at least the required first metal concentration. In similar fashion, a second stress region adjacent to the first stress region is defined that is not under a metal bump location, where the second stress region has a required second metal concentration that is less than the first metal concentration. In the second stress region, the metal density is increased by calculating a second proposed metal concentration based on a third sizing approach to adding metal to the second stress region. If the second proposed metal concentration is less than the required second metal concentration, a fourth sizing approach (e.g., changing a direction of orientation of the tiling from the third sizing approach) is used to build the integrated circuit by adding metal to the first interconnect layer in order to achieve at least the required second metal concentration. The different sizing approaches may include a first sizing approach which adds a plurality of metal strips of a first width, and a second sizing approach which adds a plurality of metal strips of a second, different width. The method may be repeated for a second metal interconnect layer by defining stress regions (e.g., a third stress region aligned with the first stress region in the first metal interconnect layer) in the second metal interconnect layer having a required third metal concentration, and then building the integrated circuit using one or more sizing approaches to increase the metal density in the second metal interconnect layer in the third stress region to at least achieve the required third metal concentration. As will be appreciated the second metal interconnect layer may be located above or below the first metal interconnect layer.

In yet another form, a method is provided for making an integrated circuit. First, an integrated circuit design is provided that includes a design for a first metal interconnect layer and for metal bump locations on a top surface of the integrated circuit. For at least a first metal interconnect layer, stress regions (e.g., first and second stress regions) are defined in relation to the metal bump locations and having respective required metal concentrations. In each stress region, the metal density is increased by calculating a proposed metal concentration based on a first sizing approach to adding metal to the first stress region. If the proposed metal concentration is determined to be less than the required metal concentration for the stress region, additional sizing approaches (e.g., changing a direction of orientation of the tiling from the first sizing approach) are used calculate additional proposed metal concentrations until the required metal concentration is met, at which time the integrated circuit is built by adding metal to the stress region in accordance with the additional proposed metal concentrations in order to achieve at least the required metal concentration. The method may also include defining a first zone and a second zone in each integrated circuit layer. With these zones, first and second stress regions in the first interconnect layer are located in the first zone, while a third stress region (having a portion under a metal bump and a required third metal concentration that is less than the first metal concentration) and an adjacent fourth stress region (having no portion under a metal bump and a required fourth metal concentration that is less than the second metal concentration) are defined to be located in the second zone. With these additional stress regions defined, the integrated circuit may be built by increasing the metal density in the first metal interconnect layer in the third stress region to at least achieve the third metal concentration, and by increasing the metal density in the fourth stress region to at least achieve the fourth metal concentration in the fourth stress region. The method may be repeated for a second metal interconnect layer by defining stress regions (e.g., a third stress region aligned with the first stress region in the first metal interconnect layer) in the second metal interconnect layer having a required third metal concentration that is less than a required first metal concentration. If a proposed third metal concentration calculated form a first sizing approach is determined to be less than the required third metal concentration for the third stress region, additional sizing approaches (e.g., changing a direction of orientation of the tiling from the first sizing approach) are used to calculate additional proposed metal concentrations until the required third metal concentration is met, at which time the integrated circuit is built by adding metal to the third stress region in accordance with the additional proposed metal concentrations in order to achieve at least the required third metal concentration. Again, the second metal interconnect layer may be located above or below the first metal interconnect layer.

Those skilled in semiconductor fabrication will appreciate that additional, conventional processing steps (not depicted) are performed as part of the fabrication of each die. As examples, transistors may be formed below the interconnect layers with various gate electrode formation, extension implant, halo implant, spacer formation, and source/drain implant steps may be performed to complete the transistors. In addition, conventional backend processing (not depicted) typically including multiple levels of interconnect is then required to connect the transistors in a desired manner to achieve the desired functionality.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making an integrated circuit, comprising:
providing an integrated circuit design including having a design for a first metal interconnect layer and for metal bump locations on a top surface of the integrated circuit;
defining a first stress region in the first metal interconnect layer, wherein the first stress region has a portion under a metal bump location and has a requirement for a first metal concentration;
defining a second stress region in the first metal interconnect layer, wherein the second stress region is adjacent to the first stress region, not under a metal bump location, and has a requirement for a second metal concentration less than the first metal concentration; and
building the integrated circuit by increasing metal in the first metal interconnect layer in the first stress region and the second stress region to at least achieve the first metal concentration in the first stress region and to at least achieve the second metal concentration in the second stress region.

2. The method of claim 1, further comprising:
defining a first zone and a second zone of the integrated circuit, wherein the first and second stress regions are in the first zone;
defining a third stress region in the second zone and in the first metal interconnect layer, wherein the third stress region has a portion under a metal bump location and has a requirement for a third metal concentration less than the first metal concentration; and
defining a fourth stress region in the first metal interconnect layer, wherein the fourth stress region is adjacent to the third stress region, is not under a metal bump location, and has a requirement for a fourth metal concentration less than the second metal concentration;
wherein building the integrated circuit is further characterized by increasing metal in the first metal interconnect layer in the third stress region and the fourth stress region to at least achieve the third metal concentration in the third stress region and to at least achieve the fourth metal concentration in the fourth stress region.

3. The method of claim 2, wherein the step of providing the integrated circuit is further characterized by the first zone comprising corner portions of the integrated circuit and the second zone comprises an interior portion of the integrated circuit.

4. The method of claim 2, wherein the step of providing the integrated circuit is further characterized by the first zone comprising a border of the integrated circuit and the second zone comprises an interior portion of the integrated circuit.

5. The method of claim 2 further comprising:
defining a third zone of the integrated circuit;
defining a fifth stress region in the third zone and in the first metal interconnect layer, wherein the fifth stress region has a portion under a metal bump location and has a requirement for a fifth metal concentration less than the third metal concentration; and
defining a sixth stress region in the first metal interconnect layer, wherein the sixth stress region is adjacent to the fifth stress region, is not under a metal bump location, and has a requirement for a sixth metal concentration less than the fourth metal concentration;
wherein building the integrated circuit is further characterized by increasing metal in the first metal interconnect layer in the fifth stress region and the sixth stress region to at least achieve the fifth metal concentration in the fifth stress region and to at least achieve the sixth metal concentration in the sixth stress region.

6. The method of claim 5, wherein the step of providing the integrated circuit is further characterized by the first zone comprising corner portions of the integrated circuit, the second zone comprising border portions not in the corner portions of the integrated circuit, and the third zone comprising an interior portion of the integrated circuit.

7. The method of claim 1, wherein providing the integrated circuit further comprises including a design for a second metal interconnect layer, wherein the second metal interconnect layer is further below the surface than the first metal interconnect layer, further comprising:
defining a third stress region, wherein the third stress region is in the second metal interconnect layer, is substantially aligned to the first stress region, and has a requirement for a third metal concentration less than the first metal concentration; and
defining a fourth stress region, wherein the fourth stress region is in the first metal interconnect layer, is substantially aligned to the second stress region, and has a requirement for a fourth metal concentration less than the second metal concentration;
wherein the step of building the integrated circuit is further characterized by increasing metal in the second metal interconnect layer in the third stress region and the fourth stress region to at least achieve the third metal concentration in the third stress region and to at least achieve the fourth metal concentration in the fourth stress region.

8. The method of claim 7, wherein the step of providing is further characterized by the integrated circuit including a plurality of interconnect layers of metal further from the surface than the first metal interconnect layer and closer to the surface than the second metal interconnect layer.

9. The method of claim 1, further comprising:
calculating a first proposed metal concentration based on a first sizing approach to adding metal to the first interconnect layer in the first stress region;
if the first proposed metal concentration is less than the first metal concentration, using a second sizing approach to adding metal to the first interconnect layer in order to achieve at least the first metal concentration.

10. The method of claim 9, wherein the step of using the second sizing approach comprises changing a direction of orientation from the first sizing approach.

11. The method of claim 10, wherein:
the step of calculating is further characterized by the first sizing approach comprising adding a plurality of metal strips of a first width; and
the step of using the second sizing approach comprises adding a plurality of metal strips of a second width different from the first width.

12. A method for making an integrated circuit, comprising:
providing an integrated circuit design including having a design for a first metal interconnect layer and for metal bump locations on a top surface of the integrated circuit;
defining a first stress region in the first metal interconnect layer, wherein the first stress region has a portion under a metal bump location and has a requirement for a first metal concentration;
calculating a first proposed metal concentration based on a first sizing approach to add metal to the first interconnect layer in the first stress region;
if the first proposed metal concentration is less than the first metal concentration, using a second sizing approach to add metal to the first interconnect layer in order to achieve at least the first metal concentration; and
building the integrated circuit by increasing metal in the first metal interconnect layer in the first stress region using the second sizing approach to at least achieve the first metal concentration in the first stress region.

13. The method of claim 12, wherein the step of using the second sizing approach comprises changing a direction of orientation from the first sizing approach.

14. The method of claim 12, wherein:
the step of calculating is further characterized by the first sizing approach comprising adding a plurality of metal strips of a first width; and
the step of using the second sizing approach comprises adding a plurality of metal strips of a second width different from the first width.

15. The method of claim 12, further comprising:
defining a second stress region in the first metal interconnect layer, wherein the second stress region is adjacent to the first stress region, not under a metal bump location, and has a requirement for a second metal concentration less than the first metal concentration;
calculating a second proposed metal concentration based on a first sizing approach to add metal to the first interconnect layer in the second stress region; and if the second proposed metal concentration is less than the second metal concentration, using a third sizing approach to add metal to the first interconnect layer in the second region in order to achieve at least the second metal concentration in the second stress region;
wherein the step of building the integrated circuit is further characterized by increasing metal in the first metal interconnect layer in the second stress region using the third sizing approach to at least achieve the second metal concentration in the second stress region.

16. The method of claim 15, wherein providing the integrated circuit further comprises including a design for a second metal interconnect layer, wherein the second metal interconnect layer is further below the surface than the first metal interconnect layer, further comprising:
defining a third stress region, wherein the third stress region is in the second metal interconnect layer, is substantially aligned to the first stress region, and has a requirement for a third metal concentration less than the first metal concentration; and
calculating a third proposed metal concentration based on a first sizing approach to add metal to the second interconnect layer in the third stress region; and
if the third proposed metal concentration is less than the third metal concentration, using a fourth sizing approach to add metal to the second interconnect layer in the third region in order to achieve at least the third metal concentration in the third stress region;
wherein the step of building the integrated circuit is further characterized by increasing metal in the second metal interconnect layer in the third stress region to at least achieve the third metal concentration in the third stress region.

17. A method for making an integrated circuit, comprising:
providing an integrated circuit design including having a design for a first metal interconnect layer and for metal bump locations on a top surface of the integrated circuit;
defining a first stress region in the first metal interconnect layer, wherein the first stress region has a portion under a metal bump location and has a requirement for a first metal concentration;
defining a second stress region in the first metal interconnect layer, wherein the second stress region is adjacent to the first stress region, not under a metal bump location, and has a requirement for a second metal concentration less than the first metal concentration; and
calculating a first proposed metal concentration based on a first sizing approach to add metal to the first interconnect layer in the first stress region;
determining that the first proposed metal concentration is less than the first metal concentration,
calculating a second proposed metal concentration based on a second sizing approach to add metal to the first interconnect layer in the first stress region;
determining that the second proposed metal concentration is at least equal to the first metal concentration; and
building the integrated circuit by increasing metal in the first metal interconnect layer in the first stress region using the second sizing approach and to at least achieve the first metal concentration in the first stress region and increasing metal in the first interconnect layer in the second stress region to at least achieve the second metal concentration in the second stress region.

18. The method of claim 17, further comprising
calculating a third proposed metal concentration based on the first sizing approach to add metal to the first interconnect layer in the second stress region;
determining that the third proposed metal concentration is less than the second metal concentration,
calculating a fourth proposed metal concentration based on a third sizing approach to add metal to the first interconnect layer in the second stress region; and
determining that the third proposed metal concentration is at least equal to the second metal concentration;
wherein the step of building the integrated circuit is further characterized by increasing metal in the first metal interconnect layer in the second stress region using the third sizing approach to at least achieve the second metal concentration in the second stress region.

19. The method of claim 17, further comprising:
defining a first zone and a second zone of the integrated circuit, wherein the first and second stress regions are in the first zone;
defining a third stress region in the second zone and in the first metal interconnect layer, wherein the third stress region has a portion under a metal bump location and has a requirement for a third metal concentration less than the first metal concentration; and
defining a fourth stress region in the first metal interconnect layer, wherein the fourth stress region is adjacent to the third stress region, is not under a metal bump location, and has a requirement for a fourth metal concentration less than the second metal concentration;
wherein building the integrated circuit is further characterized by increasing metal in the first metal interconnect layer in the third stress region and the fourth stress region to at least achieve the third metal concentration in the third stress region and to at least achieve the fourth metal concentration in the fourth stress region.

20. The method of claim 17, wherein providing the integrated circuit further comprises including a design for a second metal interconnect layer, wherein the second metal interconnect layer is further below the surface than the first metal interconnect layer, further comprising:
defining a third stress region, wherein the third stress region is in the second metal interconnect layer, is substantially aligned to the first stress region, and has a requirement for a third metal concentration less than the first metal concentration; and
calculating a third proposed metal concentration based on the first sizing approach to add metal to the second interconnect layer in the third stress region; and
determining that the third proposed metal concentration is less than the second metal concentration,
calculating a fourth proposed metal concentration based on a third sizing approach to add metal to the second interconnect layer in the third stress region; and
determining that the third proposed metal concentration is at least equal to the third metal concentration;
wherein the step of building the integrated circuit is further characterized by increasing metal in the second metal interconnect layer in the third stress region using the third sizing approach to at least achieve the third metal concentration in the third stress region.

* * * * *